United States Patent [19]

Bettman et al.

[11] Patent Number: 5,710,778
[45] Date of Patent: Jan. 20, 1998

[54] HIGH VOLTAGE REFERENCE AND MEASUREMENT CIRCUIT FOR VERIFYING A PROGRAMMABLE CELL

[75] Inventors: Roger J. Bettman, Los Altos; S. Babar Raza, Sunnyvale; Donald Yu, Fremont; Donald A. Krall, Cupertino; Anita X. Meng, Milpitas; Christopher S. Norris, Morgan Hill, all of Calif.

[73] Assignee: Cyrpress Semiconductor Corporation, San Jose, Calif.

[21] Appl. No.: 625,332

[22] Filed: Apr. 1, 1996

[51] Int. Cl.[6] .................................................. G01R 31/28
[52] U.S. Cl. ........................ 371/22.2; 371/21.4; 324/76.11
[58] Field of Search .................................. 371/22.2, 21.4; 365/201; 324/76.11, 158.1

[56] References Cited

U.S. PATENT DOCUMENTS

| | | | |
|---|---|---|---|
| 4,503,538 | 3/1985 | Fritz | 371/28 |
| 5,321,699 | 6/1994 | Endoh et al. | 371/21.5 |
| 5,463,586 | 10/1995 | Chao et al. | 365/210 |
| 5,495,442 | 2/1996 | Cernea et al. | 365/185.03 |
| 5,539,690 | 7/1996 | Talreja et al. | 365/185.22 |
| 5,568,419 | 10/1996 | Atsumi et al. | 365/185.3 |

Primary Examiner—Hoa T. Nguyen
Attorney, Agent, or Firm—Bliss McGlynn, P.C.

[57] ABSTRACT

The present invention provides a circuit for supplying a verifying reference and measurement voltage for use in verifying the programming of a programmable cell. The present invention provides the verifying reference and measurement voltage through internal circuitry on the cell and eliminate any requirement for an externally provided reference voltage. The verifying voltage is provided by modifying the programming voltage. The programming voltage is stepped down or stepped up through the use of internal circuitry to provide the reference and measurement voltage.

24 Claims, 3 Drawing Sheets

HIGH VOLTAGE REFERENCE AND MEASUREMENT CIRCUIT FOR VERIFYING A PROGRAMMABLE CELL

FIELD OF INVENTION

The present invention relates to a circuit and method for verifying the programming of a programmable cell generally and, more particularly, to a circuit and method for using a high voltage reference for verifying the programming of a programmable cell.

BACKGROUND OF THE INVENTION

A circuit for verifying the programming of a programmable cell uses an external reference voltage supplied through an analog switch to the programmable cell. The external reference voltage is typically supplied from an external device and must be higher than the input voltage Vcc supplied to the programmable cell in order for the external reference voltage to act as a high voltage reference.

Referring initially to FIG. 1, a circuit 10 is shown illustrating an implementation of a verification circuit. The circuit 10 generally contains an external reference voltage 12, an analog switch 14 and a programmable cell 16. The analog switch 14 and the programmable cell 16 are part of the internal circuitry 11 of the circuit 10. The external reference voltage is presented to an input 18 of the analog switch 14. The analog switch 14 then presents an output signal to an input 20 of the programmable cell 16. The analog switch 14 also has an input 22 that receives a verify/margin control signal. The external reference voltage 12 must be a voltage that is higher than the input voltage Vcc used by the programmable cell 16.

Referring to FIG. 2, a more detailed block diagram of the circuit 10 is shown. In one embodiment, the analog switch 14 is shown to be implemented by using a transistor 24. For illustrative purposes, FIG. 2 shows the transistor 24 as a NMOS device. When the verify/margin control signal is received at the gate 22 of the transistor 24, the external reference voltage, received at the input 18, is presented to the input 20 of the programmable cell 16.

A disadvantage of the approach shown in FIG. 1 and 2 is the external reference voltage 12 supplied separately from the internal circuitry 11. It is therefore desirable to provide a high voltage reference without an external reference voltage.

SUMMARY OF THE INVENTION

The present invention provides a circuit for supplying a verifying reference and measurement voltage for use in verifying the programming of a programmable cell. The present invention provides the verifying reference and measurement voltage through internal circuitry on the cell and eliminate any requirement for an externally provided reference voltage. The verifying voltage is provided by modifying the programming voltage. The programming voltage is stepped down or stepped up through the use of internal circuitry to provide the reference and measurement voltage.

The objects, features and advantages of the present invention include the capability of internally verifying the programming of a programmable cell. The present high voltage reference circuit can eliminate the need for a separate external reference voltage. The present circuit is particularly useful in programmable logic devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
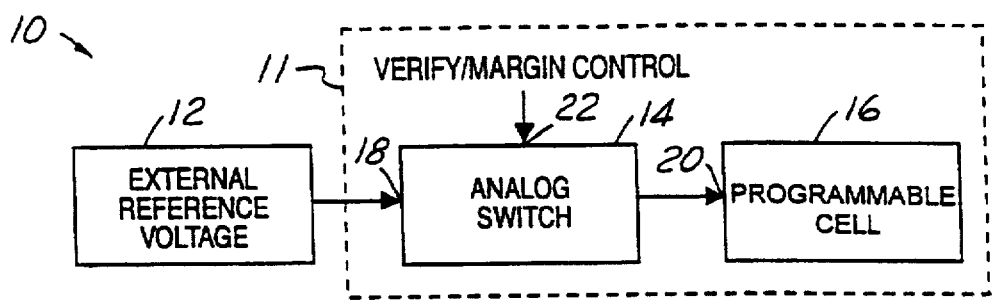
FIG. 1 is a block diagram of a verification circuit.
Figure 2:
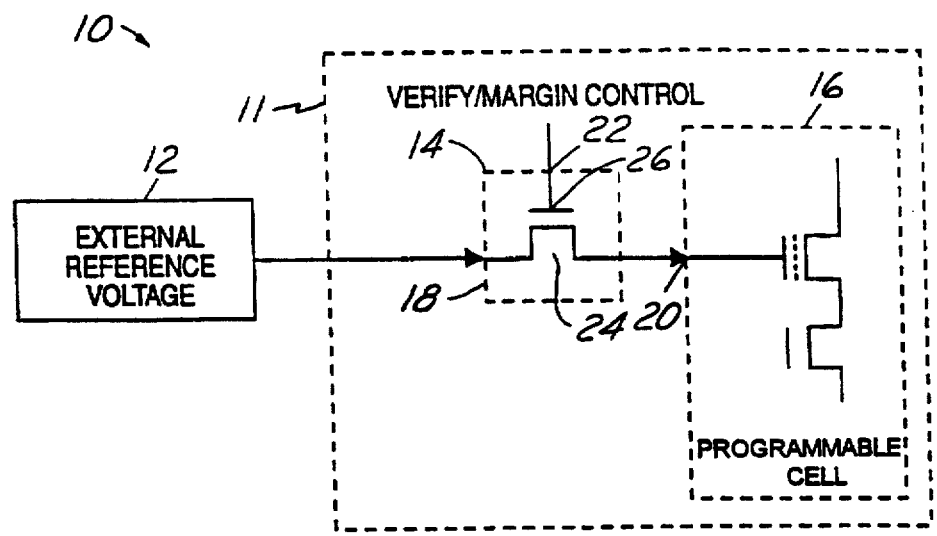
FIG. 2 is a more detailed diagram of the verification circuit.
Figure 3:
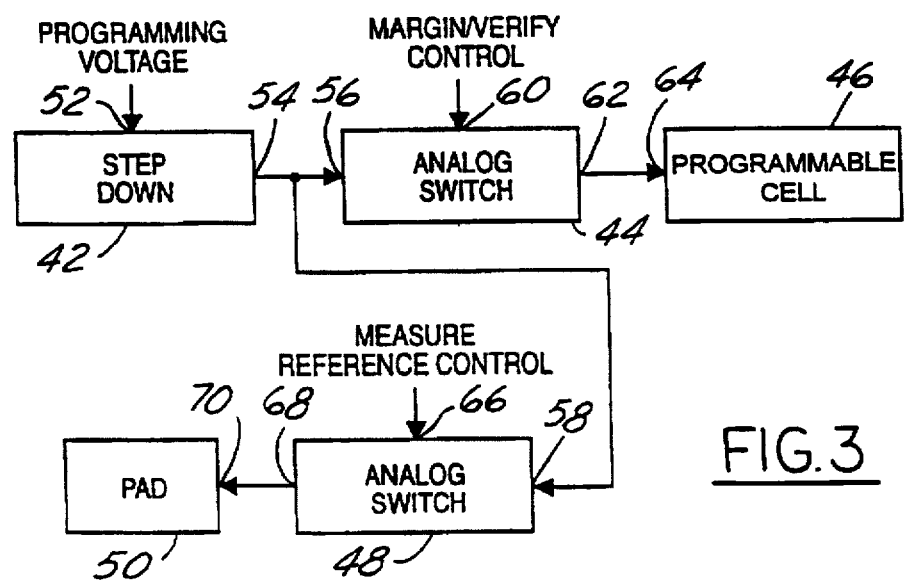
FIG. 3 is a block diagram of a preferred embodiment of the present invention.

Referring to FIG. 3, a block diagram of a reference circuit 40 is shown in accordance with a preferred embodiment of the present invention. The high voltage reference circuit 40 generally comprises a step down circuit 42, an analog switch 44, a programmable cell 46, an analog switch 48 and a pad 50. The step down circuit 42 has an input 52 that receives a programming voltage. The step down circuit 42 presents an output 54 that is received at both an input 56 of the analog switch 44 and an input 58 of the analog switch 48. The analog switch 44 also has an input 60 that receives a margin/verify control signal. The analog switch 44 has an output 62 that is presented to an input 64 of the programmable cell 46. The analog switch 48 also receives an input 66 representing a measure reference control signal. The analog switch 48 presents an output 68 that is received at an input 70 of the pad 50.

The programming voltage received at the input 52 of the step down circuit 42 may be reduced in magnitude using the internal circuitry of the step down circuit 42 to produce a verifying voltage. The verifying voltage is presented through the analog switch 44 to the input 64 of the programmable cell 46. Since the verifying voltage received at the input 64 may be generated from the internal programming voltage, an externally supplied voltage such as that required by the previous approach is not required.

The verifying voltage is also received at the input 58 of the analog switch 48. The verifying voltage is presented through the analog switch 48 and the pad 50 to an external device (not shown). The external device can be used for measurement and/or calibration of the verifying voltage.

Figure 4:
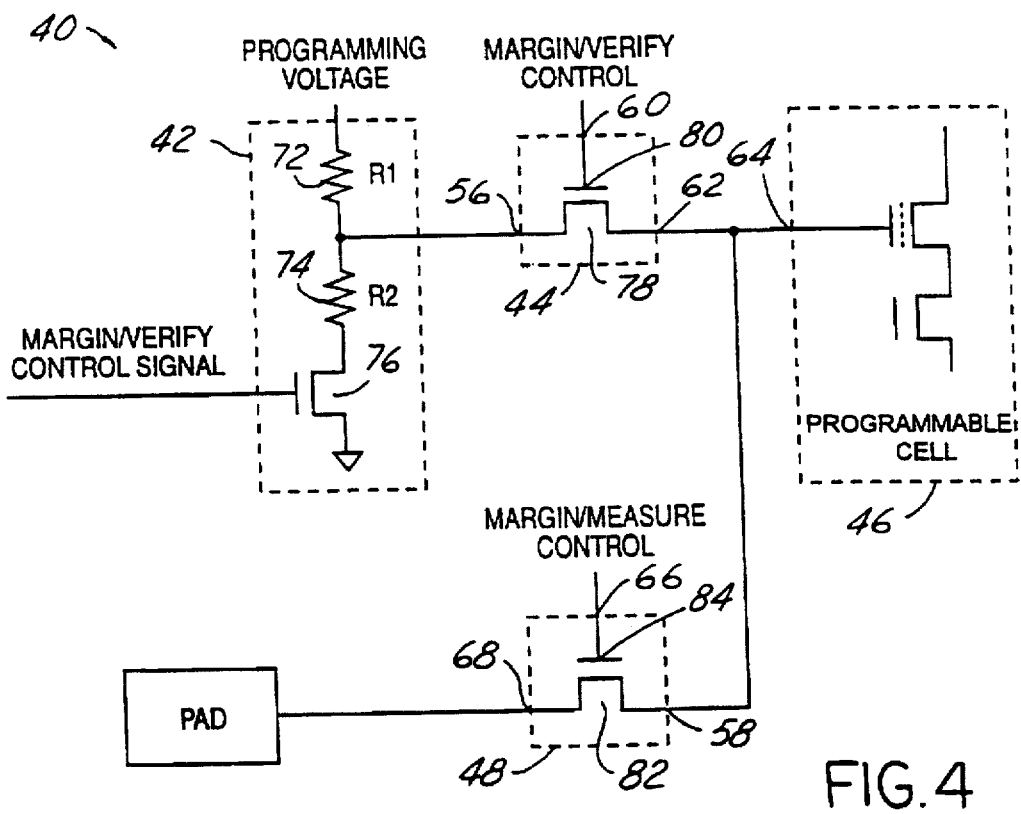
FIG. 4 is a more detailed diagram of the preferred embodiment of the present invention shown in FIG. 3.

Referring to FIG. 4, a more detailed diagram of the high voltage reference circuit 40 is shown. The step down circuit 42 comprises a first resistor 72, a second resistor 74 and a transistor 76. One side of the first resistor 72 is connected to the programming voltage. Another side of the first resistor 72 is connected to both the analog switch 44 and the second resistor 74. The second resistor 74 is also connected to the drain of the transistor 76. The source of the transistor 76 is connected to ground while the gate of the transistor 76 receives the margin/verify control signal. The first resistor 72 has a resistance R1 while the second resistor 74 has a resistance R2. The first resistor 72 and the second resistor 74 act as a voltage divider which steps down the programming voltage that is received by the analog switch 44. The transistor 76 provides a means to turn off the current path through the second resistor 74 when the step down circuit 42 is not in use. This ensures that there is no power consumption when the part is not in the verify/margin mode.

The analog switch 44 includes a transistor 78 that has a gate 80 which receives the input 60. The input 56 is received at the source of the transistor 78. The output 62 is presented from the drain of the transistor 78. The input 56 receives the verifying voltage from the step down circuit 42. The output 62 is presented to the test input 64 of the programmable cell 46. The transistor 78 presents the verifying voltage to the test input 64 of the programmable cell 46 when the margin/verifying control signal, received at the gate 80, is at a first digital state. When the margin/verify control signal is at a second digital state, the verifying voltage is not presented to the test input 64.

The verifying voltage is also presented to the input 58 of the analog switch 48. The analog switch 48 comprises a transistor 82 that has a gate 84. The transistor 82 works similarly to the transistor 78. The verifying voltage received at the input 58 is presented at the output 68 when a margin/measure control signal, received at the gate 84, is at a first digital state. When the margin/measure control signal is at a second digital state, no verifying voltage is presented at the output 68.

Figure 5:
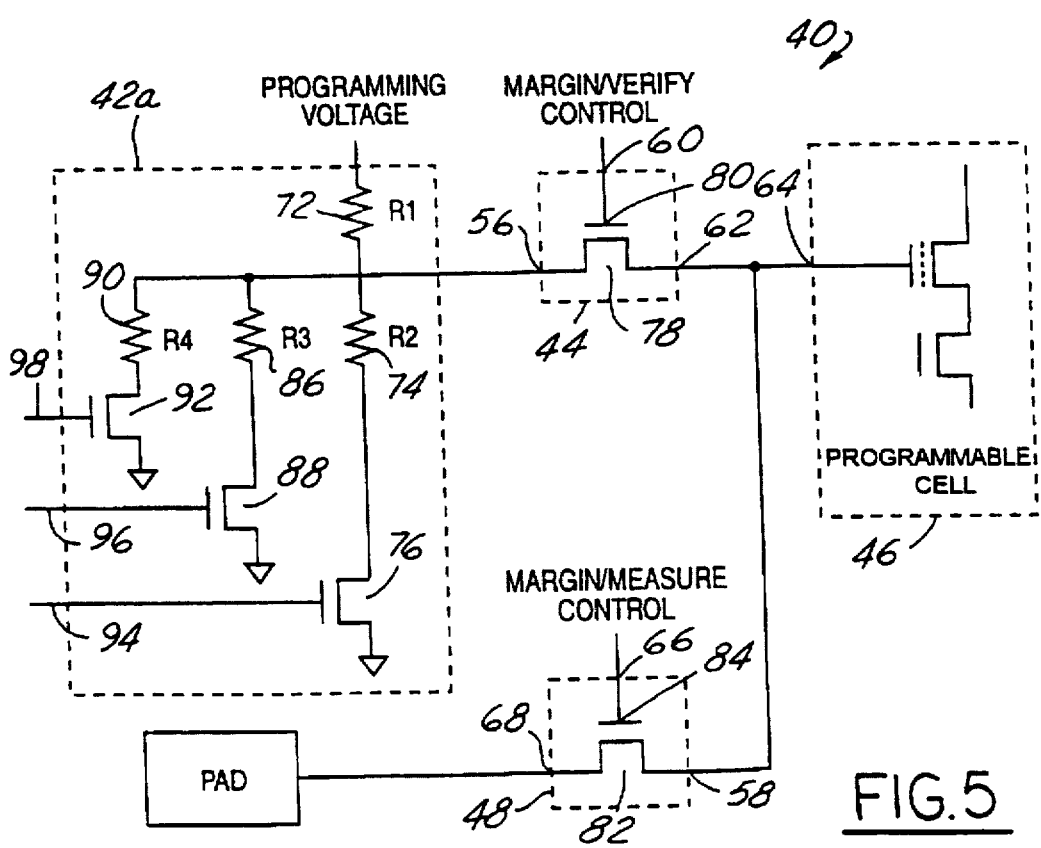
FIG. 5 is an alternate embodiment of the present invention illustrating a programmable step down circuit.

Referring to FIG. 5, an alternate embodiment of the high voltage reference circuit 40 is shown. The step down circuit 42a is modified to include the first resistor 72, the second resistor 74, a third resistor 86, a fourth resistor 90, the transistor 76, a transistor 88 and a transistor 92. The third resistor 86 creates a resistance R3, while the fourth resistor 90 creates a resistance R4. The transistor 76 may function as a switch to turn off the second resistor 74 when a control signal is present at the input 94. The transistor 88 may function as a switch to turn off the third resistor 86 when a control signal is present at the control signal input 96. Similarly, the transistor 92 may function as a switch to turn off the fourth resistor 90 when a control signal is present at the control signal input 98.

Each of the control signal inputs 94, 96 and 98 may be used to configure the amount of voltage reduction provided by the step down circuit 42a. Specifically, the second resistor 74, the third resistor 86 or the fourth resistor 90 can be turned on to produce a specific resistance that creates a specific voltage reduction by the step down circuit 42. Alternatively, any two of the second resistor 74, the third resistor 86 or the fourth resistor 90 can be turned on to create a specific resistance that creates a specific voltage reduction by the step down circuit 42a. Additionally, the second resistor 74, the third resistor 86 and the fourth resistor 90 can all be turned on to create another specific resistance that creates another specific voltage reduction by the step down circuit 42. Additional resistors can be implemented in the step down circuit 42a to create additional voltage reductions. Furthermore, the control signal inputs 94, 96 and 98 may be adjusted to match the number of resistors implemented in the step down circuit 42a. Also, the number of transistors may match the number of resistors implemented in the step down circuit 42a. The control signal inputs 94, 96 and 98 can be implemented as either individual single bit control inputs, or can be tied to a common multi-bit bus where each one of the bits of the multi-bit bus would be connected to a specific one of the individual control signal inputs 94, 96 and 98.

Figure 6:
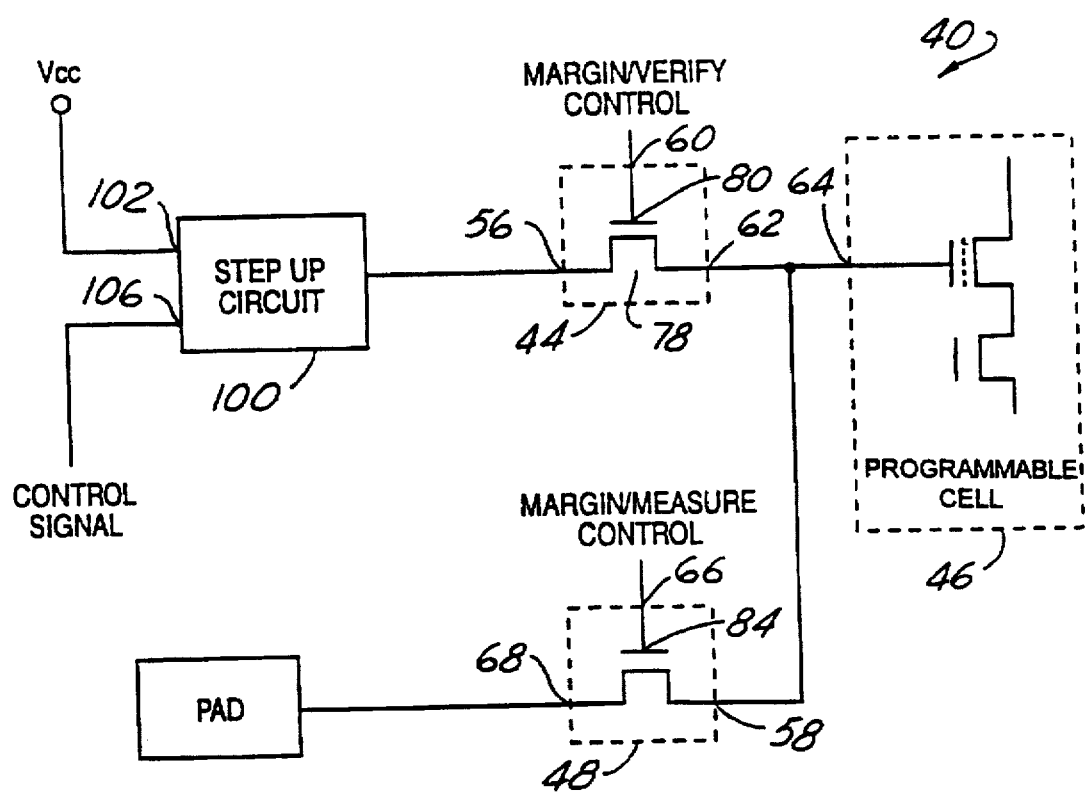
FIG. 6 is a second alternate embodiment of the present invention illustrating a step up circuit.

Referring to FIG. 6, a second alternative embodiment of the high voltage reference circuit is shown. The step down circuit 42 (or 42a) is replaced with a step up circuit 100. The step up circuit has an input 102 that receives an input voltage Vcc and an input 106 that receives the control signal. The step up circuit 100 may be implemented in a design application where the programming voltage may be lower than the input test voltage 64 that is required by the programmable cell 46. The step up circuit 100 uses the input voltage Vcc to generate a voltage greater than Vcc at the input 56.

The step up circuit 100 may be implemented by using a transistor array, a single transistor or any other type of circuitry that would increase the input voltage Vcc by a predetermined amount. The step up circuit 100 also has an input 106 that receives a control signal. The control signal may determine the amount of the increase of the voltage that the step up circuit 100 adds to generate the voltage at the input 56.

The present invention can eliminate the need for an additional externally provided voltage to verify the programming of a programmable cell. The embodiment illustrated in FIGS. 3 and 4 may reduce the programming voltage (supplied either on chip or externally) by a specific predetermined amount. The reduced voltage can then be used to verify the programming of the programmable cell 46. In a preferred embodiment, the present invention reduces the overall complexity of the circuit by eliminating an additional externally provided voltage. The embodiment illustrated in FIG. 5 provides additional flexibility in the step down circuit 42a by providing multiple control signal inputs 94, 96 and 98 that control a number of internal resistances. As a result, the step down circuit 42a may provide a programmable amount of voltage decrease in producing the test input voltage 64. The embodiment illustrated in FIG. 6 converts the step down circuit to a step up circuit in applications where the programming voltage is less than the verifying voltage of the programmable cell 46.

While the invention has been particularly shown and described with reference to the preferred embodiments thereof, it will be understood by those skilled in the art that various changes in form and details may be made without departing from the spirit and scope of the invention.

We claim:

1. A circuit for providing a verifying voltage signal comprising:

a step down circuit having an input coupled to a programming voltage and an output for providing a verifying voltage less than said programming voltage;

a programmable cell having a test input; and a first switch having (a) an input coupled to the output of said step down circuit and (b) an output that presents said output of said step down circuit to said test input when a control input is at a first digital state and does not present said verifying voltage to said test input when said control input is at a second digital state.

2. The circuit according to claim 1 wherein said step down circuit further comprises:

a first resistor having an input coupled to said programming voltage and an output for providing said verifying voltage; and a second resistor having an input coupled to said output of said first resistor and an output coupled to ground.

3. The circuit according to claim 2 wherein said step down circuit further comprises a second switch having an input coupled to said output of second resistor, an output coupled to ground and a control input that receives a control signal, wherein said second switch deactivates said second resistor when said control signal is at a first digital state and activates said second resistor when said control signal is at a second digital state.

4. The circuit according to claim 3 wherein said first and second switches are transistors.

5. The circuit according to claim 1 further comprising a pad having (a) an input coupled to the output of said step down circuit and (b) an output coupled to an external device for measurement and/or calibration of said verifying voltage.

6. The circuit according to claim 5 further comprising a second switch having an input coupled to the output of said step down circuit, an output coupled to said input of said pad and a second control signal, said second switch deactivates said pad when said second control signal is at a first digital state and activates said pad when said second control signal is at a second digital state.

7. The circuit according to claim 6 wherein said second switch is a transistor.

8. The circuit according to claim 1 wherein said step down circuit further comprises:
  a first resistor having an input coupled to said programming voltage and an output for providing said verifying voltage; and
  a plurality of second resistors each having an input coupled to said output of said first resistor and an output coupled to ground.

9. The circuit according to claim 8 wherein said step down circuit further comprises a plurality of second switches each having an input coupled to said output of one of said second resistors, an output coupled to ground and a control input that receives a control signal, each of said second switches deactivates one of said second resistors when one of said control signals is at a first digital state and activates one of said second resistors when one of said control signals is at a second digital state.

10. The circuit according to claim 8 wherein each of said second switches is activated independently.

11. The circuit according to claim 8 wherein each of said second switches is a transistor.

12. The circuit according to claim 1 wherein said verifying voltage is programmable.

13. A circuit for providing a verifying voltage signal comprising:
  a step up circuit having an input coupled to a programming voltage and an output for providing a verifying voltage, said verifying voltage being higher than said programming voltage;
  a programmable cell having a test input; and
  a first switch having (a) an input coupled to the output of said step down circuit and (b) an output that presents said output of said step down circuit to said test input when a control input is at a first digital state and does not present said verifying voltage to said test input when said control input is at a second digital state.

14. The circuit according to claim 13 wherein said step up circuit further comprises a plurality of transistors.

15. The circuit according to claim 14 wherein said first switch comprises a transistor.

16. The circuit according to claim 13 wherein said verifying voltage is programmable.

17. The circuit according to claim 13 further comprising a pad having (a) an input coupled to the output of said step up circuit and (b) an output coupled to an external device for measurement and/or calibration of said verifying voltage.

18. The circuit according to claim 17 further comprising a second switch having an input coupled to the output of said step up circuit, an output coupled to said input of said pad and a second control signal, said second switch deactivates said pad when said second control signal is at a first digital state and activates said pad when said second control signal is at a second digital state.

19. The circuit according to claim 18 wherein said second switch is a transistor.

20. A method for presenting a verifying voltage to a programmable cell, comprising the steps of:
  (a) receiving a programming voltage in a means for altering a power supply level;
  (b) presenting an output from said means for altering a power supply level to a switching means, said output being different from said programming voltage; and
  (c) presenting said output of said altering means to a programming cell when a control signal is at a first digital state and not presenting said output of said altering means to said programming cell when said control signal is at a second digital state.

21. The method according to claim 20 wherein said verifying voltage being greater than said programming voltage.

22. A circuit for verifying the programming of a programmable cell, comprising:
  (a) means for altering a power supply level;
  (b) said programmable cell; and
  (c) switching means for (i) transmitting said signal from said means for altering a power supply level to said programming cell in response to a control signal at a first digital state and (ii) not transmitting said signal from said means for altering a power supply level to said programming cell when said control signal is at a second digital state.

23. The circuit of claim 22, further comprising:
  (d) means for transmitting said signal from said means for altering a power supply level to a means for measuring and/or calibrating the power level of said signal from said means for altering a power supply level; and
  (e) said means for measuring and/or calibrating the power level of said signal from said means for altering a power supply level.

24. A programmable logic device comprising the circuit of claim 22.

* * * * *